(12) United States Patent  (10) Patent No.: US 12,119,217 B2
Song et al.  (45) Date of Patent: Oct. 15, 2024

(54) SUBSTRATE TREATMENT METHOD AND SUBSTRATE TREATMENT APPARATUS

(71) Applicant: SEMES CO., LTD., Chungcheongnam-do (KR)

(72) Inventors: Si Nae Song, Chungcheongnam-do (KR); Sung Bum Park, Chungcheongnam-do (KR); Ho Jin Jeong, Chungcheongnam-do (KR); Dong Ho Lim, Chungcheongnam-do (KR)

(73) Assignee: SEMES CO., LTD., Chungcheongnam-Do (KR)

( * ) Notice: Subject to any disclaimer, the term of this patent is extended or adjusted under 35 U.S.C. 154(b) by 24 days.

(21) Appl. No.: 18/119,870

(22) Filed: Mar. 10, 2023

(65) Prior Publication Data

US 2024/0162032 A1    May 16, 2024

(30) Foreign Application Priority Data

Nov. 10, 2022   (KR) .................. 10-2022-0149493

(51) Int. Cl.
*H01L 21/02* (2006.01)
*B08B 3/02* (2006.01)
*B08B 3/08* (2006.01)
*B08B 13/00* (2006.01)
*H01L 21/67* (2006.01)
*H01L 21/687* (2006.01)

(52) U.S. Cl.
CPC ........ *H01L 21/02057* (2013.01); *B08B 3/022* (2013.01); *B08B 3/08* (2013.01); *B08B 13/00* (2013.01); *H01L 21/67051* (2013.01); *H01L 21/68764* (2013.01)

(58) Field of Classification Search
None
See application file for complete search history.

(56) References Cited

U.S. PATENT DOCUMENTS

2013/0000682 A1*  1/2013  DeKraker ......... H01L 21/67051
                                                    134/28
2020/0012254 A1   1/2020  Hirata et al.

FOREIGN PATENT DOCUMENTS

| JP | 2005-259931 A   | 9/2005 |
| KR | 10-2006-0085590 A | 7/2006 |
| KR | 10-2019-0087298 A | 7/2019 |
| KR | 10-2020-0006004 A | 1/2020 |

* cited by examiner

*Primary Examiner* — Eric W Golightly
(74) *Attorney, Agent, or Firm* — Carter, DeLuca & Farrell LLP

(57) ABSTRACT

A substrate treatment method includes an auto-recovery operation of automatically recovering a substrate when a treatment process of treating the substrate is interrupted due to an occurrence of an abnormality and a chamber neutralization operation of neutralizing an inside of a process chamber including the substrate before the auto-recovery operation after the treatment process is stopped.

15 Claims, 11 Drawing Sheets

SUBSTRATE TREATMENT METHOD AND SUBSTRATE TREATMENT APPARATUS

CROSS-REFERENCE TO RELATED APPLICATION(S)

This application claims the benefit under 35 USC 119(a) of Korean Patent Application No. 10-2022-0149493 filed on Nov. 10, 2022 in the Korean Intellectual Property Office, the entire disclosure of which is incorporated herein by reference for all purposes.

BACKGROUND

1. Field

The present disclosure relates to a substrate treatment method and a substrate treatment apparatus.

2. Description of Related Art

In general, integrated circuit (IC) devices, such as semiconductor devices, may be manufactured by repeatedly performing a series of treatment processes on a semiconductor substrate used as a substrate. For example, electrical circuit patterns constituting IC devices may be formed on a substrate by performing treatment processes, such as deposition, photolithography, etching, cleaning, and drying.

Among the treatment processes, the etching process or the cleaning process involves a plurality of operations, such as a chemical treatment process for supplying an etching liquid or a cleaning liquid to the substrate being rotated, a rinsing process for supplying a rinsing liquid, and a drying treatment process for supplying a drying gas to the substrate, to treat the substrate.

Meanwhile, if the treatment process is stopped due to a problem (abnormality) occurring in the process chamber during the treatment process, a recovery operation of recovering the substrate with a recovery recipe is performed.

However, there may be a problem in that an explosive chemical reaction may occur due to mixing of a treatment liquid used in the treatment process and remaining in the process chamber and a chemical liquid used in the recovery operation.

RELATED ART DOCUMENT

[Patent Document]
(Patent Document 1) Korean Patent Laid-Open Publication No. 10-2020-0006004

SUMMARY

Exemplary embodiments provide a substrate treatment method and a substrate treatment apparatus for neutralizing a residual treatment liquid inside a process chamber.

According to an exemplary embodiment, a substrate treatment method includes: an auto-recovery operation of automatically recovering a substrate when a treatment process of treating the substrate is interrupted due to an occurrence of an abnormality; and a chamber neutralization operation of neutralizing an inside of a process chamber including the substrate before the auto-recovery operation after the treatment process is stopped.

In the chamber neutralization operation, a neutralization liquid for neutralizing a residual treatment liquid inside the process chamber used in the treatment process may be discharged to the substrate.

In the chamber neutralization operation, when the residual treatment liquid is an acidic liquid, the neutralization liquid may be a basic liquid, and when the residual treatment liquid is a basic liquid, the neutralization liquid may be an acidic liquid, the basic liquid may include SC-1, and the acidic liquid may include at least one of SC-2, HF, SPM, sulfuric acid and DSP.

The chamber neutralization operation may include: a pre-cleaning operation of discharging a pre-cleaning liquid to the substrate; a neutralization liquid discharge operation of discharging a neutralization liquid to the substrate; and a post-cleaning operation of discharging a post-cleaning liquid to the substrate.

The substrate treatment method may further include: prior to the chamber neutralization operation, a vessel control operation of adjusting a height of a treatment vessel including a plurality of bowls so that the residual treatment liquid is recovered by one selected from among the plurality of bowls arranged around the substrate according to a type of the residual treatment liquid.

The treatment process may include a plurality of process operations of treating the substrate, and in the vessel control operation, when one of the plurality of process operations of the treatment process is interrupted, a current height of the treatment vessel may be maintained, and when one of the plurality of process operations of the treatment process is stopped while switching to a following process operation, the treatment vessel stopped while moving to a next height corresponding to the following process operation may be continuously moved to the next height.

The plurality of bowls arranged around the substrate may include a first bowl, a second bowl, and a third bowl sequentially arranged to be adjacent to the substrate, and the first bowl, the second bowl, and the third bowl may be sequentially connected to a first recovery line, a second recovery line, and a third recovery line, and the third recovery line connected to the third bowl may be connected to a waste line and a recycle line through a three-way valve, wherein the substrate treatment method may further include: prior to the chamber neutralization operation, a valve control operation of controlling the three-way valve so that the third recovery line communicates with one of the waste line and the recycle line according to a type of the residual treatment liquid.

In the valve control operation, when the residual treatment liquid is a chemical liquid requiring recycling, the three-way valve may be controlled so that the third recovery line and the recycle line communicate with each other, and when the residual treatment liquid is not a chemical liquid requiring recycling, the three-way valve may be controlled so that the third recovery line and the waste line communicate with each other.

A rotation speed of the substrate may be changed in the chamber neutralization operation.

The rotation speed of the substrate may be changed between 300 RPM and 1500 RPM.

According to another exemplary embodiment, a substrate treatment method includes: a plurality of process operations constituting a treatment process of processing a substrate; an auto-recovery operation of automatically recovering the substrate when the treatment process is stopped due to an occurrence of an abnormality; a chamber neutralization operation of neutralizing an inside of a process chamber including the substrate by discharging a neutralization liquid for neutralizing a residual treatment liquid inside the process chamber used in the treatment process to the substrate before the auto-recovery operation after the treatment process is stopped; prior to the chamber neutralization operation, a vessel control operation of adjusting a height of the treatment vessel including a plurality of bowls so that the residual treatment liquid is recovered by one selected from among the plurality of bowls arranged around the substrate according to a type of the residual treatment liquid; and prior to the chamber neutralization operation, a valve control operation of controlling a three-way valve so that a recovery line connected to one of the plurality of bowls communicates with one selected from a waste line and a recycle line according to the type of the residual treatment liquid.

According to another exemplary embodiment, a substrate treatment apparatus includes: a process chamber; a treatment vessel installed in the process chamber and having a treatment space for processing a substrate; a support unit supporting the substrate in the treatment space and rotating the substrate; a nozzle unit discharging a treatment liquid to the substrate; a liquid supply line supplying the treatment liquid to the nozzle unit; and a controller neutralizing an inside of the process chamber before the substrate is recovered, when the treatment process of treating the substrate is stopped due to an occurrence of an abnormality, wherein the controller controls the liquid supply line and the nozzle unit so that a neutralization liquid for neutralizing the residual treatment liquid inside the process chamber used in the treatment process is supplied through the liquid supply line and discharged to the substrate by the nozzle unit.

BRIEF DESCRIPTION OF DRAWINGS

The above and other aspects, features, and advantages of the present inventive concept will be more clearly understood from the following detailed description, taken in conjunction with the accompanying drawings, in which.

DETAILED DESCRIPTION

Figure 1:
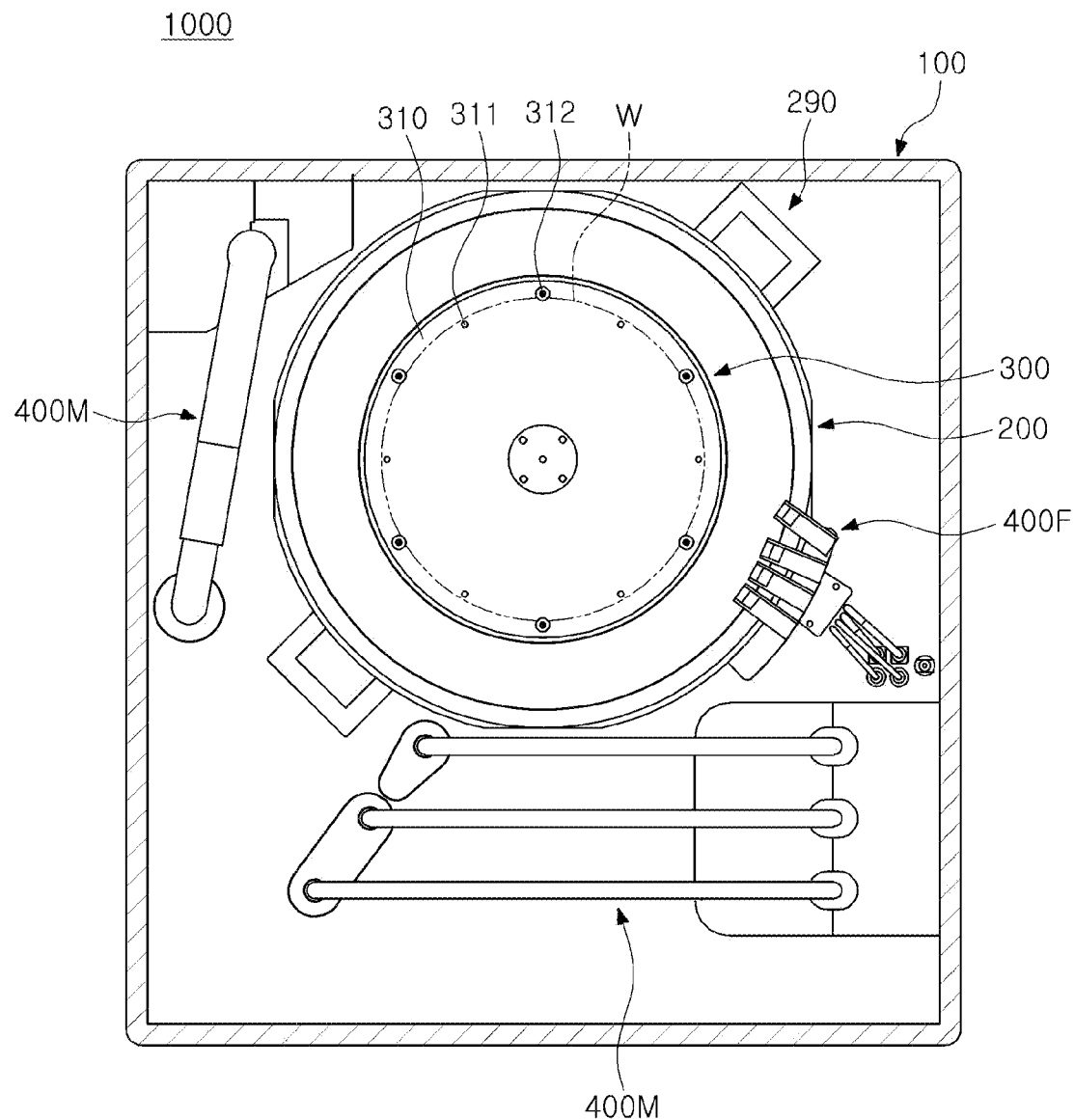
FIG. 1 is a plan view illustrating a substrate treatment apparatus according to an exemplary embodiment in the present disclosure.

Hereinafter, exemplary embodiments will be described in detail with reference to the accompanying drawings such that they may be easily practiced by those skilled in the art to which the present disclosure pertains. In describing the present disclosure, if a detailed explanation for a related known function or construction is considered to unnecessarily divert the gist of the present disclosure, such explanation will be omitted but would be understood by those skilled in the art. Also, similar reference numerals are used for the similar parts throughout the specification. In this disclosure, terms, such as "above," "upper portion," "upper surface," "below," "lower portion," "lower surface," "lateral surface," and the like, are determined based on the drawings, and in actuality, the terms may be changed according to a direction in which a device or an element is disposed.

It will be understood that when an element is referred to as being "connected to" another element, it may be directly connected to the other element or intervening elements may also be present. In contrast, when an element is referred to as being "directly connected to" another element, no intervening elements are present. In addition, unless explicitly described to the contrary, the word "comprise" and variations, such as "comprises" or "comprising," will be understood to imply the inclusion of stated elements but not the exclusion of any other elements.

Figure 2:
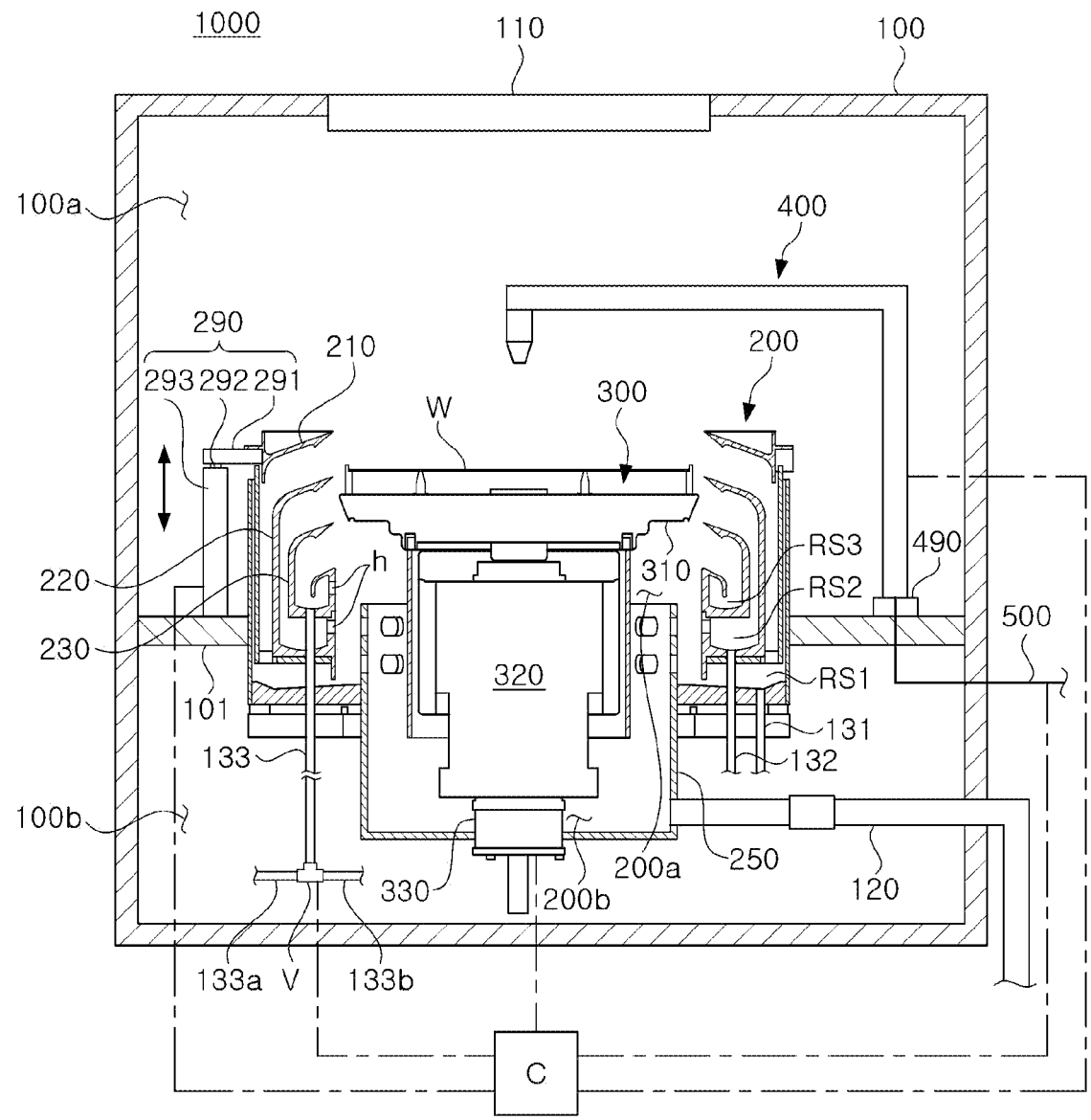
FIG. 2 is a view illustrating an inside of the substrate treatment apparatus of FIG. 1.

FIG. 1 is a plan view illustrating a substrate treatment apparatus according to an exemplary embodiment in the present disclosure, FIG. 2 is a view illustrating an inside of the substrate treatment apparatus of FIG. 1, and FIGS. 3A through 3C are diagrams illustrating that a treatment vessel of the substrate treatment apparatus of FIG. 2 moves up and down.

Referring to the drawings, a substrate treatment apparatus 1000 of the present disclosure includes a process chamber 100 performing a treatment on a substrate W with a liquid. In the process chamber 100, a treatment is performed on a substrate W, while the substrate W is held horizontally. The treatment may be etching a nitride film formed on the substrate W. At this time, the liquid may include phosphoric acid. Furthermore, the process chamber 100 may be used in a treatment of removing foreign substances and a film remaining on a surface of the substrate W using various liquids.

Specifically, the process chamber 100 provides a sealed internal space, and a fan filter unit 110 is installed on the top. The fan filter unit 110 generates a vertical airflow inside the process chamber 100. The fan filter unit 110, which is a modularized unit of a filter and an air supply fan, filters clean air and supplies the clean air to the inside of the process chamber 100. After passing through the fan filter unit 110, the clean air is supplied to the process chamber 100 to form a vertical airflow. This vertical airflow provides a uniform airflow over the substrate W, and contaminants (fumes) occurring in the process of treating the surface of the substrate W by a treatment fluid are discharged along with the air to recovery lines 131, 132, and 133 through bowls 210, 220, and 230 of the treatment vessel 200, thereby maintaining high cleanliness inside the treatment vessel.

The process chamber 100 includes a process region 100a and a maintenance region 100b partitioned by a horizontal partition 101. A driving member 293 of a lifting unit 290 and a driving member 490 of a nozzle unit 400 are installed on the horizontal partition 101. In addition, the maintenance region 100b is a space in which the recovery lines 131, 132, and 133 connected to the treatment vessel 200 and an exhaust member 120 are located. The maintenance region 100b may be isolated from the process region 100a in which the substrate W is treated.

In the substrate treatment apparatus 1000 of the present disclosure, the treatment vessel 200, a support unit 300, and a nozzle unit 400 may be included in the process chamber 100. The treatment vessel 200 is installed inside the process chamber 100, has a cylindrical shape with an open upper portion, and provides a treatment space for treating the substrate W. The open upper portion of the treatment vessel 200 serves as a passage for carrying in and out the substrate W. Here, the support unit 300 is located in the treatment space. At this time, the support unit 300 supports the substrate W and rotates the substrate W during a process.

In addition, the treatment vessel 200 provides an upper space 200a in which a spin head 310 of the support unit 300 is located and a lower space 200b connected to an exhaust duct 250 in a lower portion so that forced exhaust is performed. The exhaust duct 250 is connected to the exhaust member 120 extending to the outside of the process chamber 100. In the upper space 200a of the treatment vessel 200, the annular first bowl, second bowl, and third bowl 210, 220, and 230 for introducing and intaking a chemical liquid scattered on the substrate W that rotates and gas are arranged in multiple stages. The first, second, and third bowls 210, 220, and 230 have exhaust ports h communicating with a common annular space (corresponding to a lower space of the treatment vessel).

Here, the plurality of bowls 210, 220, and 230 provide a plurality of recovery spaces RS1, RS2, and RS3 into which an airflow including liquid scattered from the substrate W and fumes are introduced. The first recovery space RS1 is partitioned and formed by the first bowl 210, a second recovery space RS2 is formed as a space between the first bowl 210 and the second bowl 220, and the third recovery space RS3 is formed as a space between the second bowl 220 and the third bowl 230.

In addition, the treatment vessel 200 is coupled to the lifting unit 290 changing a vertical position of the treatment vessel 200. The lifting unit 290 linearly moves the treatment vessel 200 in a vertical direction. As the treatment vessel 200 moves up and down, a relative height of the treatment vessel 200 with respect to the spin head 310 changes. The lifting unit 290 includes a bracket 291, a lifting shaft 292, and a driving member 293. The bracket 291 is fixedly installed on an outer wall of the treatment vessel 200, and the lifting shaft 292 moved vertically by the driving member 293 is fixedly coupled to the bracket 291. When the substrate W is loaded into or unloaded from the spin head 310, the treatment vessel 200 descends so that the spin head 310 protrudes upwardly from the treatment vessel 200.

In addition, during the process, a height of the treatment vessel 200 is adjusted so that the liquid flows into each of the bowls 210, 220, and 230 set (selected) according to the type of liquid supplied to the substrate W. Accordingly, a relative vertical position between the treatment vessel 200 and the substrate W changes. Accordingly, the treatment vessel 200 may have different types of liquid and contaminant gas recovered for each of the recovery spaces RS1, RS2, and RS3.

The support unit 300 is installed inside the treatment vessel 200. The support unit 300 supports the substrate W during the process and may be rotated by the driving member 330 during the process. In addition, the support unit 300 has the spin head 310 having a circular upper surface. A plurality of support pins 311 and a plurality of chucking pins 312 supporting the substrate W are provided on an upper surface of the spin head 310. The plurality of support pins 311 are arranged at the edge of the upper surface of the spin head 310 at regular intervals and spaced apart from each other at a predetermined interval, and protrude upwardly from the spin head 310. The support pins 311 support a lower surface of the substrate W so that the substrate W is supported while being spaced apart from the spin head 310 in an upward direction. A plurality of chucking pins 312 are disposed outside the support pin 311, and the chucking pins 312 protrude upwardly. The plurality of chucking pins 312 align the substrate W supported by the plurality of support pins 311 so that the substrate W is placed in a proper position on the spin head 310. During the process, the plurality of chucking pins 312 are in contact with a side portion of the substrate W to prevent the substrate W from being separated from the proper position thereof. The support shaft 320 supporting the spin head 310 is connected to a lower portion of the spin head 310, and the support shaft 320 is rotated by the driving member 330 connected to a lower end thereof. At this time, the driving member 330 is provided as a motor or the like, and as the support shaft 320 rotates by the driving member 330, the spin head 310 and the substrate W rotate.

Meanwhile, the nozzle unit 400 discharges a liquid to the substrate W supported by the support unit 300. The nozzle unit 400 may be a moving nozzle device 400M or a fixed nozzle device 400F. At this time, a plurality of moving nozzle devices 400M may be installed outside the treatment vessel 200.

Figure 4:
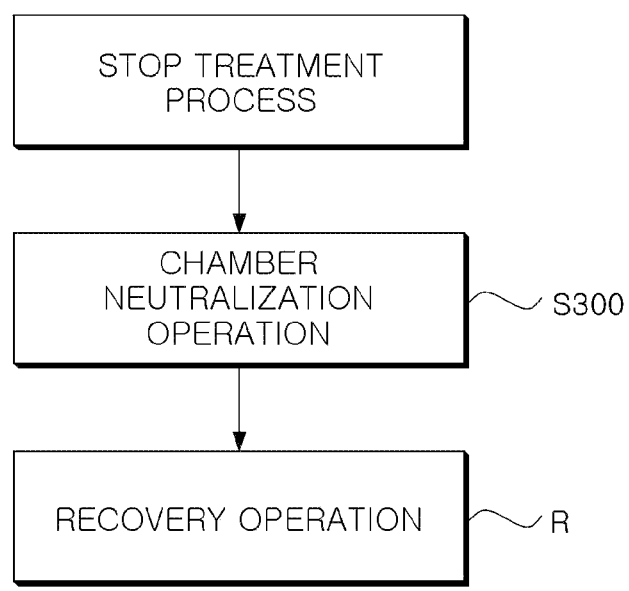
FIG. 4 is a flowchart illustrating a substrate treatment method according to a first exemplary embodiment in the present disclosure.
Figure 5:
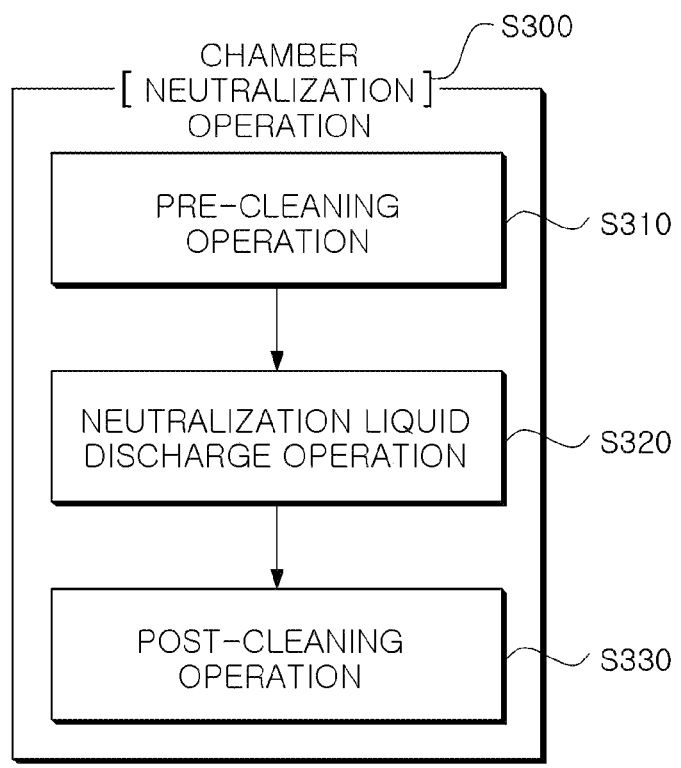
FIG. 5 is a flowchart specifically illustrating a chamber neutralization operation in the substrate treatment method of FIG. 4.

FIG. 4 is a flowchart illustrating a substrate treatment method according to a first exemplary embodiment in the present disclosure, and FIG. 5 is a flowchart specifically illustrating a chamber neutralization operation in the substrate treatment method of FIG. 4.

Referring to the drawings, the substrate treatment method of the present disclosure includes a recovery operation R and a chamber neutralization operation (S300).

The recovery operation R is an operation of automatically recovering a substrate when a treatment process for treating the substrate is interrupted due to the occurrence of an abnormality.

Here, the treatment process includes a plurality of process operations of treating the substrate. As an example, the substrate may be treated using different treatment liquids in a plurality of process operations. In the process of treating the substrate according to such a treatment process, the occurrence of an abnormality may be a case in which a problem occurs in the process chamber or the supply of a treatment liquid is not smooth. When the treatment process is stopped due to the occurrence of such an abnormality, that is, in the case of an emergency stop, the recovery operation R is performed.

The recovery operation R is performed to automatically recover the substrate according to a recovery recipe when the treatment process is stopped due to an abnormality. At this time, the recovery recipe is set to various processes selected by a user, and any recovery recipe in the related art may be utilized, of course.

Meanwhile, there is a problem in that an explosive chemical reaction may occur as a residual treatment liquid remaining in the process chamber after being used in the treatment process is mixed with a chemical liquid used in the recovery operation R. As an example, when a sulfuric acid peroxide mixture (SPM) as a mixed liquid of sulfuric acid and hydrogen peroxide, which is a residual treatment liquid, and isopropyl alcohol, which is a chemical liquid in the recovery operation R, react, a highly explosive acetone peroxide-based material is generated due to a chemical reaction between oxidized IPA and hydrogen peroxide, a risk of explosion is very high.

In order to overcome this problem, the present disclosure includes the chamber neutralization operation (S300).

The chamber neutralization operation (S300) is an operation performed before the recovery operation R after the treatment process is stopped, and is an operation of neutralizing the inside of the process chamber including the substrate.

An abnormality may occur during the treatment process of treating the substrate, and at this time, a treatment liquid used in the treatment process may remain inside the process chamber including the substrate. The chamber neutralization operation (S300) is implemented by discharging a neutralization liquid for neutralizing the residual treatment liquid inside the process chamber to the substrate. First, when the neutralization liquid is discharged to the substrate, the residual treatment liquid on the substrate may be neutralized. In addition, while the neutralization liquid discharged to the substrate is scattered by rotation of the substrate and recovered through one of a plurality of bowls, and in this process, the residual treatment liquid remaining in the bowel and the recovery line inside the process chamber may be neutralized. In the chamber neutralization operation (S300), when the residual treatment liquid is an acidic liquid, the neutralization liquid is a basic liquid, and when the residual treatment liquid is a basic liquid, the neutralization liquid is an acidic liquid. As an example, the basic liquid may include SC-1, and the acidic liquid may include at least one of SC-2, HF, SPM, sulfuric acid, and DSP, but, without being limited thereto, any chemical liquid of the related art capable of neutralizing the residual treatment liquid may be used.

Specifically, the chamber neutralization operation (S300) may include a pre-cleaning operation (S310), a neutralization liquid discharge operation (S320), and a post-cleaning operation (S330).

The pre-cleaning operation (S310) is an operation of discharging a pre-cleaning liquid to the substrate, in which the inside of the process chamber together with the substrate are cleaned to a certain degree before neutralizing the residual treatment liquid with the neutralization liquid. In the neutralization liquid discharge operation (S320), the neutralization liquid is discharged to the substrate, in which the residual treatment liquid remaining in the process chamber is neutralized with the neutralization liquid. Finally, the post-cleaning operation (S330) is an operation of discharging a post-cleaning liquid to the substrate, in which the substrate and the inside of the process chamber are surely cleaned after the residual treatment liquid is neutralized with the neutralization liquid.

As described above, in the present disclosure, the chamber neutralization operation (S300) of neutralizing the residual treatment liquid inside the process chamber including the substrate with the neutralization liquid is provided before the recovery operation R after the treatment process is stopped, an explosive chemical reaction between the residual treatment liquid and the chemical liquid in the recovery operation R may be prevented.

To perform the chamber neutralization operation (S300), the substrate treatment apparatus 1000 includes a controller C as illustrated in FIG. 2. The controller C neutralizes the inside of the process chamber 100 including the substrate W before the substrate W is recovered, when the treatment process for treating the substrate W is interrupted due to the occurrence of an abnormality. Specifically, the controller C is electrically connected to a liquid supply line 500 and the nozzle unit 400. The controller C controls the liquid supply line 500 and the nozzle unit 400 to discharge the neutralization liquid to the substrate through the liquid supply line 500 and the nozzle unit 400. Consequently, the residual treatment liquid inside the process chamber 100 including the substrate W is neutralized.

Figure 6:
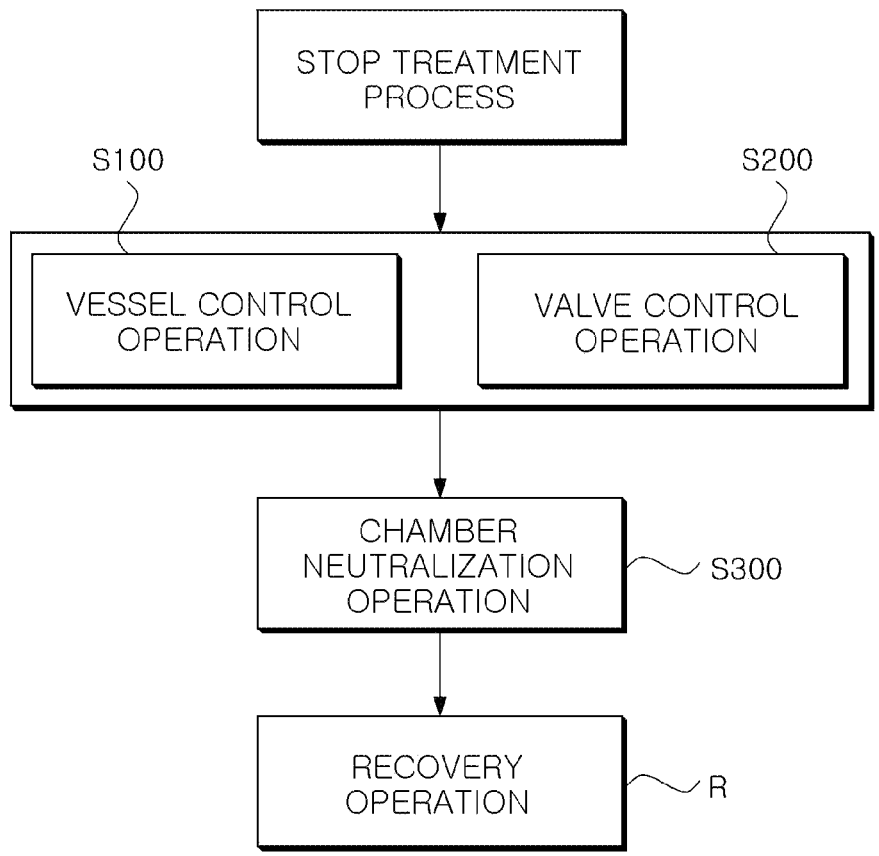
FIG. 6 is a flowchart illustrating a substrate treatment method according to a second exemplary embodiment in the present disclosure.
Figure 7:
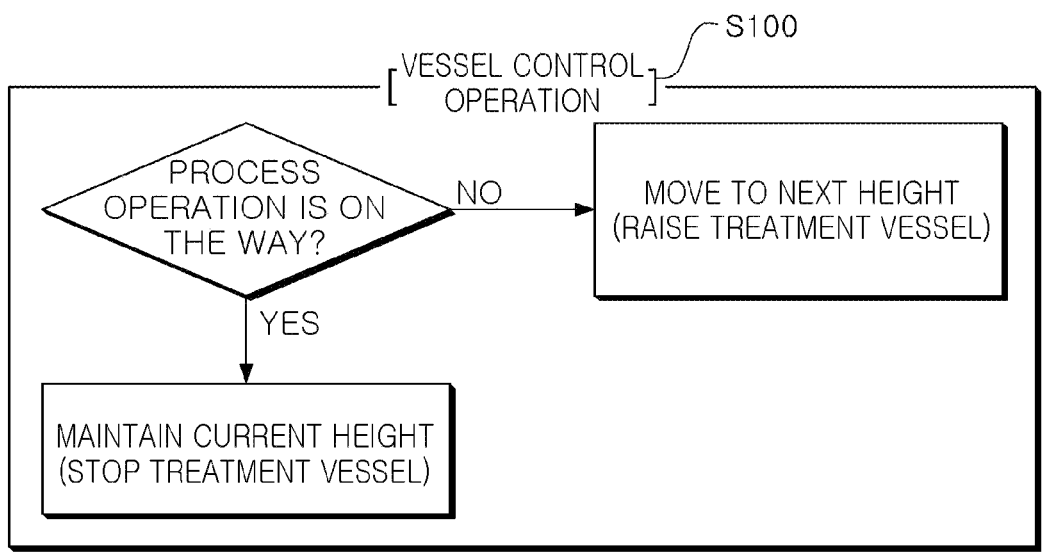
FIG. 7 is a flowchart specifically illustrating a vessel control operation in the substrate treatment method of FIG. 5.
Figure 8:
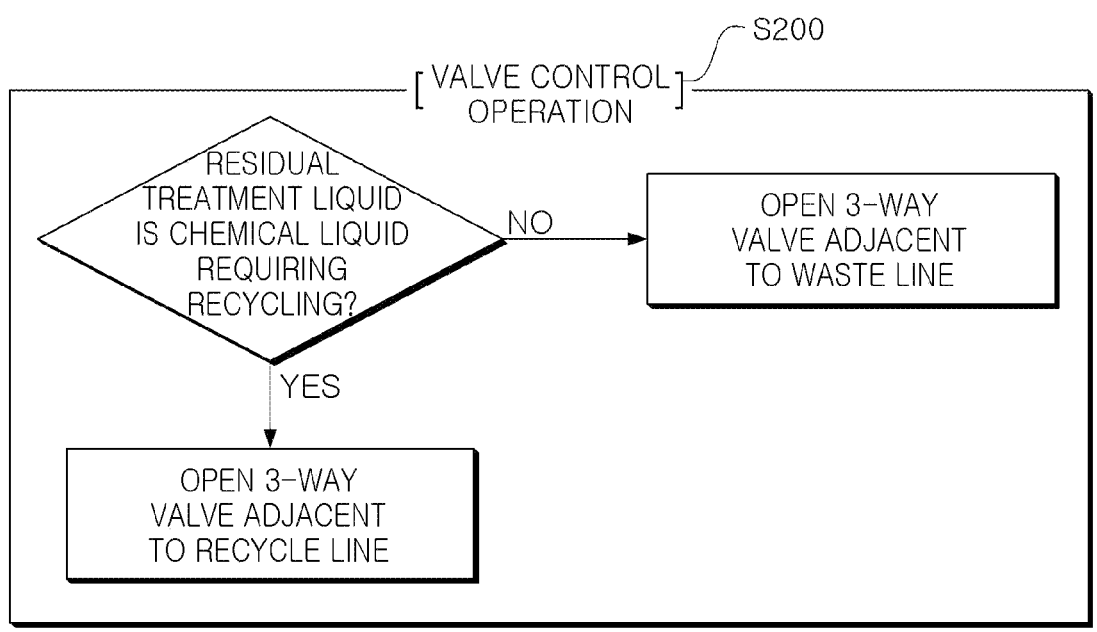
FIG. 8 is a flowchart specifically illustrating a valve control operation in the substrate treatment method of FIG. 5.

FIG. 6 is a flowchart illustrating a substrate treatment method according to a second exemplary embodiment in the present disclosure, FIG. 7 is a flowchart specifically illustrating a vessel control operation (S100) in the substrate treatment method of FIG. 6, and FIG. 8 is a flowchart specifically illustrating a valve control operation (S200) in the substrate treatment method of FIG. 6.

Referring to FIGS. 6 and 7, the present disclosure may further include the vessel control operation (S100) before the chamber neutralization operation (S300) after stopping the treatment process.

The vessel control operation (S100) is an operation of adjusting a height of a treatment vessel according to the type of residual treatment liquid.

Figure 3A:
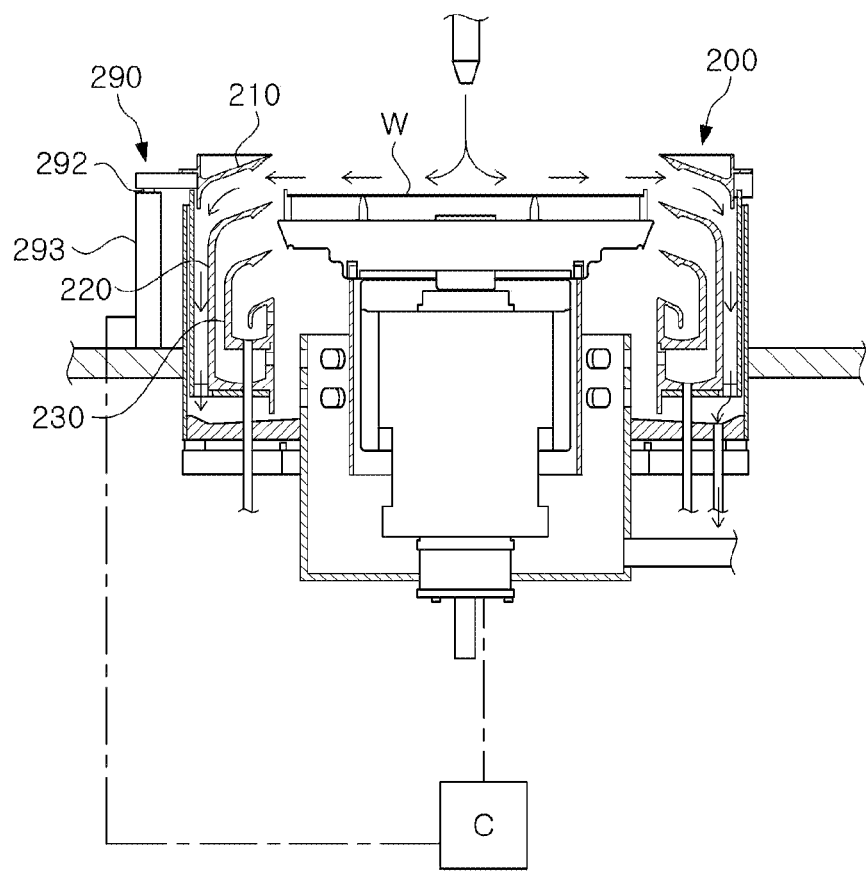
FIGS. 3A through 3C are diagrams illustrating that a treatment vessel of the substrate treatment apparatus of FIG. 2 moves up and down.
Figure 3B:
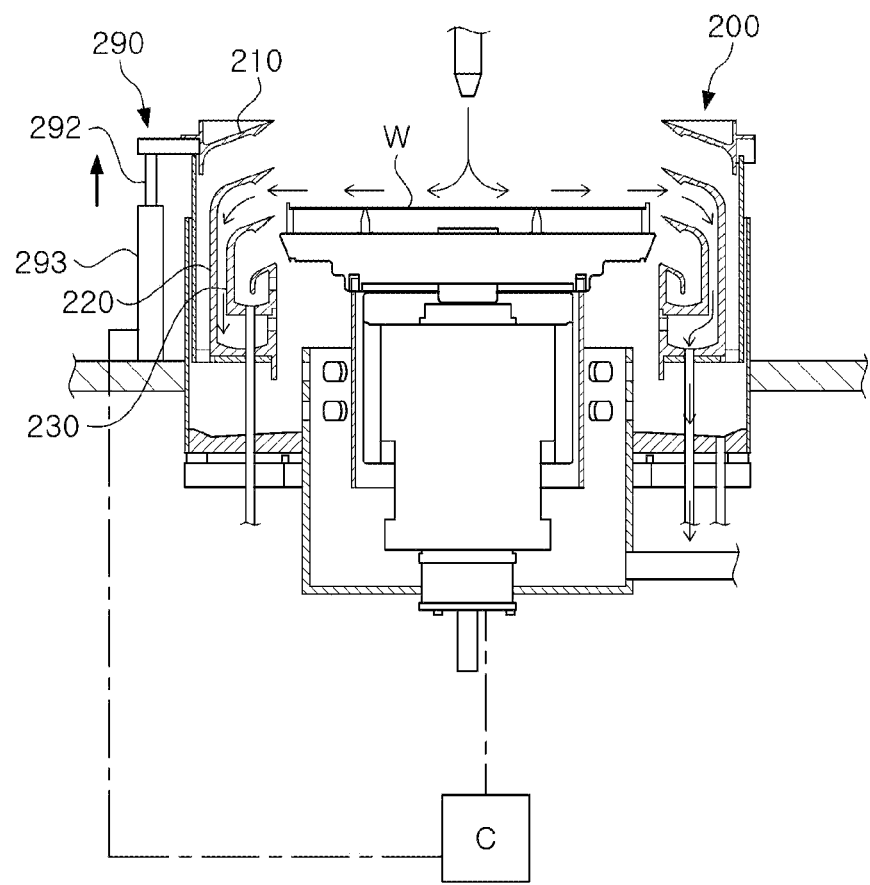
Figure 3C:
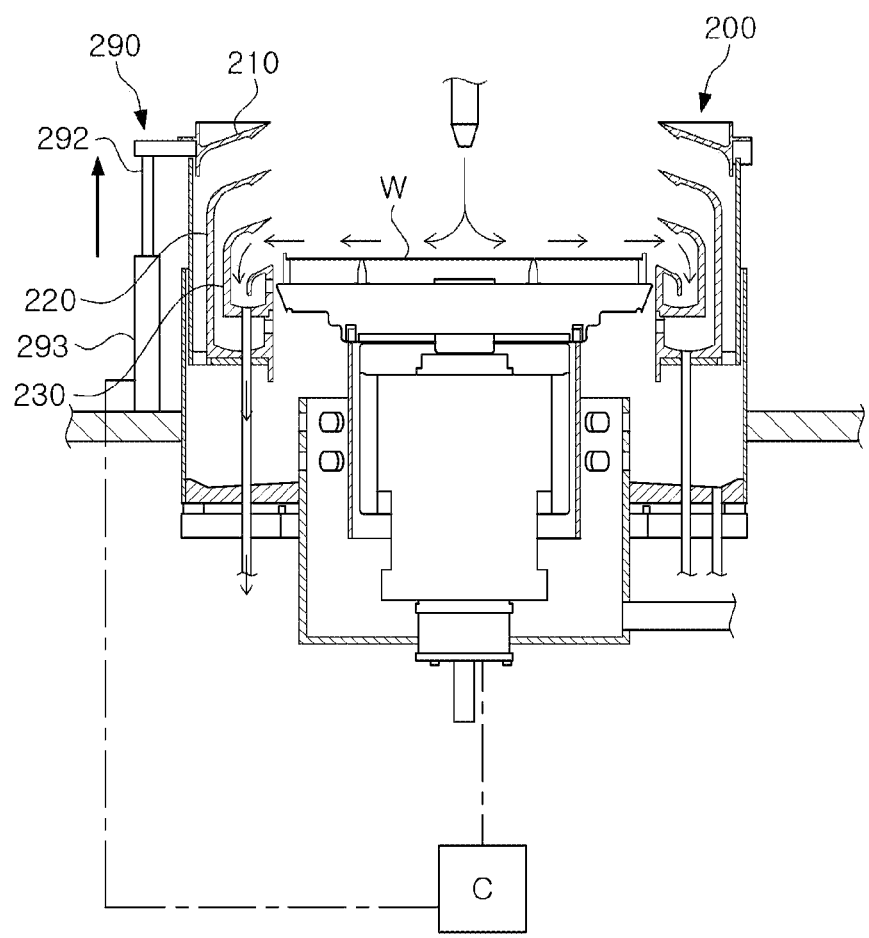

In detail, in the vessel control operation (S100), the height of the treatment vessel including a plurality of bowls is adjusted so that the residual treatment liquid is recovered to one selected from among the plurality of bowls disposed around the substrate according to the type of the residual treatment liquid. At this time, as illustrated in FIGS. 2 and 3A to 3C, the adjustment of the height of the treatment vessel may be implemented according to an operation of the lifting unit 290 controlled by the controller C electrically connected to the lifting unit 290. That is, the height of the treatment vessel 200 may be adjusted as the lifting shaft 292 moves up and down by the controller C controlling the driving member 293 of the lifting unit 290. As an example, as illustrated in FIG. 3A, when the lifting shaft 292 of the lifting unit 290 is located at the lowest position, the first bowl 210 is disposed in a lateral direction of the substrate W and the treatment liquid scattered by the rotation of the substrate W is recovered by the first bowl 210. In addition, as illustrated in FIG. 3B, in a state in which the lifting shaft 292 of the lifting unit 290 is raised to a certain extent, the second bowl 220 is disposed in the lateral direction of the substrate W, so that the treatment liquid scattered by the rotation of the substrate W is recovered by the second bowl 220. Also, as illustrated in FIG. 3C, in a state in which the lifting shaft 292 of the lifting unit 290 is raised to be relatively higher, the third bowl 230 is disposed in the lateral direction of the substrate W, so that the treatment liquid scattered by the rotation of the substrate W is recovered by the third bowl 230.

More specifically, the treatment process includes a plurality of process operations pf treating the substrate, and in the vessel control operation (S100), the height of the treatment vessel may be adjusted according to the progress of the plurality of process operations.

That is, in the vessel control operation (S100), when one process operation among a plurality of process operations of the treatment process is interrupted, a current height of the treatment vessel is maintained.

In addition, in the vessel control operation (S100), when one process operation among a plurality of process operations of the treatment process is stopped while switching to a following process operation, the treatment vessel may be continuously moved to a next height. When one process operation is stopped while switching to a following process operation, the treatment vessel stops while moving to a next height corresponding to a following process operation. At this time, in the vessel control operation (S100), the treatment vessel stopped while moving to the next height is continuously moved to the next height.

As described above, according to the present disclosure, the vessel control operation (S100) of adjusting the height of the treatment vessel is configured before the chamber neutralization operation (S300) after the treatment process is stopped, so that a residual treatment liquid may be recovered with one selected from a plurality of bowls according to the type of the residual treatment liquid. In addition, the present disclosure may prevent an explosive chemical reaction between the residual treatment liquid and the chemical liquid of the recovery operation R in the bowl and the recovery line by this configuration.

Referring to FIGS. 2, 6 and 8, the present disclosure may further include a valve control operation (S200) before the chamber neutralization operation (S300) after the treatment process is stopped.

The valve control operation (S200) is an operation of controlling a valve according to the type of residual treatment liquid.

The plurality of bowls disposed around the substrate include the first bowl 210, the second bowls 220, and the third bowl 230 sequentially arranged to be adjacent to the substrate. The first bowl 210, the second bowl 220, and the third bowl 230 are sequentially connected to the first recovery line 131, the second recovery line 132, and the third recovery line 133. Also, the third recovery line 133 connected to the third bowl 230 is connected to a waste line 133*a* and a recycle line 133*b* through a three-way valve V.

In this structure, in the valve control operation (S200), before the chamber neutralization operation (S300), the three-way valve V is controlled to communicate with one of the waste line 133*a* and the recycle line 133*b* according to the type of residual treatment liquid.

Specifically, in the valve control operation (S200), when the residual treatment liquid is a chemical liquid requiring recycling, the three-way valve V is controlled so that the third recovery line 133 and the recycle line 133*b* communicate with each other. In addition, in the valve control operation (S200), when the residual treatment liquid is not a chemical liquid requiring recycling, the three-way valve V is controlled so that the third recovery line and the waste line 133*a* communicate with each other. That is, when the residual treatment liquid is a chemical liquid requiring recycling, the residual treatment liquid recovered through the third recovery line 133 is accommodated in a recycling tank (not illustrated) through the recycle line 133*b* and recycled. Meanwhile, when the residual treatment liquid is not a chemical liquid requiring recycling, the residual treatment liquid recovered through the third recovery line 133 is discarded through the waste line 133*a*.

As an example, when a process operation of discharging the SPM as a treatment liquid among a plurality of process operations in the treatment process is stopped during the process, the three-way valve V is controlled so that the third recovery line 133 and the recycle line 133*b* communicate with each other, thereby sending the residual treatment liquid to the recycle line 133*b*. Furthermore, after the process operation of discharging the SPM, among the plurality of process operations, is completed, there may be residual treatment liquid in the third recovery line 133 within about 30 seconds, and thus, in this case, the three-way valve V may also be controlled so that the third recovery line 133 and the recycle line 133*b* communicate with each other.

In order to perform this valve control operation (S200), the substrate treatment apparatus is configured so that the controller C is electrically connected to the three-way valve V, as illustrated in FIG. 2. The controller C controls the three-way valve V so that the third recovery line communicates with one selected from among the waste line 133*a* and the recycle line 133*b* according to the type of residual treatment liquid.

Figure 9:
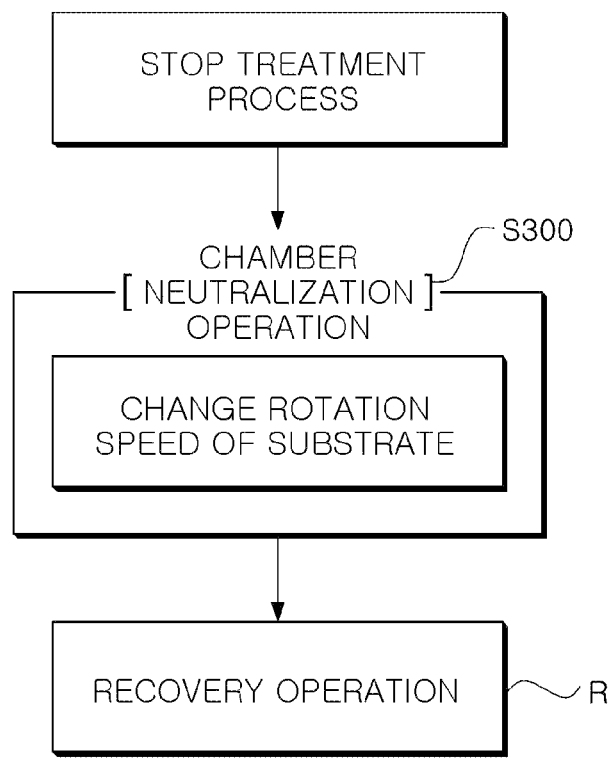
FIG. 9 is a flowchart illustrating a substrate treatment method according to a third exemplary embodiment in the present disclosure.

FIG. 9 is a flowchart illustrating a substrate treatment method according to a third exemplary embodiment in the present disclosure.

Referring to the drawings, in the chamber neutralization operation (S300) of the present disclosure, a rotation speed of the substrate may be changed. Specifically, as illustrated in FIG. 5, the chamber neutralization operation (S300) may include the pre-cleaning operation (S310), the neutralization liquid discharge operation (S320), and the post-cleaning operation (S330), and the rotation speed of the substrate may be changed in the pre-cleaning operation (S310), the neutralization liquid discharge operation (S320), and the post-cleaning operation (S330).

In the chamber neutralization operation (S300), when scattered from the substrate, a pre-cleaning liquid, a neutralization liquid, and a post-cleaning liquid are scattered to a low height of the bowl when the rotation speed of the substrate is low, and are scattered to a high height of the bowl when the rotation speed of the substrate is high.

Accordingly, when the rotation speed of the substrate is changed in the chamber neutralization operation (S300), the neutralization liquid may be uniformly scattered over the entire portion of the bowl, thereby neutralizing the residual treatment liquid in the entire portion of the bowl. In addition, due to this configuration, the pre-cleaning liquid and the post-cleaning liquid may be uniformly scattered over the entire portion of the bowl, so that the entire portion of the bowl may be cleaned.

In the chamber neutralization operation (S300), the rotation speed of the substrate may be changed between 300 and 1500 RPM. When the RPM of the substrate is less than 300, scattering of the chemical liquid rarely occurs. When the RPM of the substrate is greater than 1500, scattering of the chemical liquid is so strong that the chemical liquid may pass to the outside of the treatment vessel or bounce back to the substrate after colliding with the bowl.

To change the rotation speed of the substrate, the substrate treatment apparatus 1000 has a configuration in which the controller C is electrically connected to the driving member 330 of the support unit 300 as illustrated in FIG. 2. The controller C controls the support unit 300 to change the rotation speed of the substrate W in the process of discharging the neutralization liquid to the substrate W.

The present disclosure provides the chamber neutralization operation of neutralizing the residual treatment liquid inside the process chamber including the substrate with a neutralization liquid before the recovery operation after the treatment process is stopped, thereby preventing an explosive chemical reaction between the residual treatment liquid and the chemical liquid in the recovery operation.

While exemplary embodiments have been illustrated and described above, it will be apparent to those skilled in the art that modifications and variations could be made without departing from the scope of the present disclosure as defined by the appended claims.

What is claimed is:
1. A substrate treatment method comprising:
automatically recovering a substrate when treating the substrate is interrupted due to an occurrence of an abnormality;
neutralizing an inside of a process chamber including the substrate before the recovering after the treating is stopped; and before the neutralizing,
adjusting a height of a treatment vessel including a plurality of bowls so that a residual treatment liquid used in the treating is recovered by one selected from among the plurality of bowls arranged around the substrate according to a type of the residual treatment liquid.

2. The substrate treatment method of claim 1, wherein the neutralizing includes discharging a neutralization liquid to the substrate for neutralizing the residual treatment liquid inside the process chamber.

3. The substrate treatment method of claim 2, wherein in the neutralizing,
when the residual treatment liquid is an acidic liquid, the neutralization liquid is a basic liquid, and when the residual treatment liquid is a basic liquid, the neutralization liquid is an acidic liquid, and
wherein the basic liquid includes SC-1, and the acidic liquid includes at least one of SC-2, HF, SPM, sulfuric acid and DSP.

4. The substrate treatment method of claim 1, wherein the neutralizing further includes:
discharging a pre-cleaning liquid to the substrate;
discharging a neutralization liquid to the substrate; and
discharging a post-cleaning liquid to the substrate.

5. The substrate treatment method of claim 1, further comprising a plurality of process operations of treating the substrate, and
in the adjusting,
when one of the plurality of process operations is interrupted, a current height of the treatment vessel is maintained, and
when one of the plurality of process operations is stopped while switching to a following process operation, the treatment vessel stopped while moving to a next height corresponding to the following process operation is continuously moved to the next height.

6. The substrate treatment method of claim 1, wherein the plurality of bowls arranged around the substrate include a first bowl, a second bowl, and a third bowl sequentially arranged to be adjacent to the substrate, and the first bowl, the second bowl, and the third bowl are sequentially connected to a first recovery line, a second recovery line, and a third recovery line, and the third recovery line connected to the third bowl is connected to a waste line and a recycle line through a three-way valve,
wherein the substrate treatment method further comprises, prior to the neutralizing,
controlling the three-way valve so that the third recovery line communicates with one of the waste line and the recycle line according to a type of the residual treatment liquid.

7. The substrate treatment method of claim 6, wherein, in the controlling,
when the residual treatment liquid is a chemical liquid requiring recycling, the three-way valve is controlled so that the third recovery line and the recycle line communicate with each other, and
when the residual treatment liquid is not a chemical liquid requiring recycling, the three-way valve is controlled so that the third recovery line and the waste line communicate with each other.

8. The substrate treatment method of claim 2, wherein a rotation speed of the substrate is changed in the neutralizing.

9. The substrate treatment method of claim 8, wherein the rotation speed of the substrate is changed between 300 RPM and 1500 RPM.

10. A substrate treatment method comprising:
a plurality of processes constituting treating a substrate;
automatically recovering a substrate when treating is stopped due to an occurrence of an abnormality;
neutralizing an inside of a process chamber including the substrate by discharging a neutralization liquid for neutralizing a residual treatment liquid inside the process chamber used in the treating before the automatically recovering after a treatment process is stopped;
prior to the neutralizing, adjusting a height of a treatment vessel including a plurality of bowls so that the residual treatment liquid is recovered by one selected from among the plurality of bowls arranged around the substrate according to a type of the residual treatment liquid; and
prior to the neutralizing, controlling a three-way valve so that a recovery line connected to one of the plurality of bowls communicates with one selected from a waste line and a recycle line according to the type of the residual treatment liquid.

11. The substrate treatment method of claim 10, wherein in the neutralizing,
when the residual treatment liquid is an acidic liquid, the neutralization liquid is a basic liquid, and when the residual treatment liquid is a basic liquid, the neutralization liquid is an acidic liquid, and
wherein the basic liquid includes SC-1, and the acidic liquid includes at least one of SC-2, HF, SPM, sulfuric acid and DSP.

12. The substrate treatment method of claim 10, wherein the neutralizing includes:
discharging a pre-cleaning liquid to the substrate;
discharging a neutralization liquid to the substrate; and
discharging a post-cleaning liquid to the substrate.

13. The substrate treatment method of claim 10, wherein in the adjusting,
the treating is interrupted, a current height of the treatment vessel is maintained, and
when the treating is stopped while switching to a following process operation, the treatment vessel stopped while moving to a next height corresponding to a following process operation is continuously moved to the next height.

14. The substrate treatment method of claim 10, wherein the plurality of bowls arranged around the substrate include a first bowl, a second bowl, and a third bowl sequentially arranged to be adjacent to the substrate, and the first bowl, the second bowl, and the third bowl are sequentially connected to a first recovery line, a second recovery line, and a third recovery line, and the third recovery line connected to the third bowl is connected to a waste line and a recycle line through a three-way valve, and
in the controlling,
when the residual treatment liquid is a chemical liquid requiring recycling, the three-way valve is controlled so that the third recovery line and the recycle line communicate with each other, and
when the residual treatment liquid is not a chemical liquid requiring recycling, the three-way valve is controlled so that the third recovery line and the waste line communicate with each other.

15. The substrate treatment method of claim 10, wherein a rotation speed of the substrate is changed in the neutralizing, and the rotation speed of the substrate is changed between 300 RPM and 1500 RPM.

* * * * *